(12) United States Patent
Lo

(10) Patent No.: US 9,029,999 B2
(45) Date of Patent: May 12, 2015

(54) SEMICONDUCTOR SENSOR DEVICE WITH FOOTED LID

(75) Inventor: Wai Yew Lo, Petaling Jaya (MY)

(73) Assignee: Freescale Semiconductor, Inc., Austin, TX (US)

( * ) Notice: Subject to any disclaimer, the term of this patent is extended or adjusted under 35 U.S.C. 154(b) by 732 days.

(21) Appl. No.: 13/303,166

(22) Filed: Nov. 23, 2011

(65) Prior Publication Data

US 2013/0126988 A1  May 23, 2013

(51) Int. Cl.
*H01L 23/24* (2006.01)
*H01L 25/00* (2006.01)
*H01L 23/00* (2006.01)
*H01L 23/495* (2006.01)

(52) U.S. Cl.
CPC ............ *H01L 25/50* (2013.01); *H01L 24/97* (2013.01); *H01L 2224/32245* (2013.01); *H01L 2224/48247* (2013.01); *H01L 2224/73265* (2013.01); *H01L 2224/97* (2013.01); *H01L 23/49575* (2013.01)

(58) Field of Classification Search
None
See application file for complete search history.

(56) References Cited

U.S. PATENT DOCUMENTS

| | | | |
|---|---|---|---|
| 4,314,225 A | 2/1982 | Tominaga | |
| 5,581,226 A | 12/1996 | Shah | |
| 5,604,363 A | 2/1997 | Ichihashi | |
| 5,692,637 A | 12/1997 | Hodge | |
| 5,719,069 A | 2/1998 | Sparks | |
| 5,811,684 A | 9/1998 | Sokn | |
| 5,831,170 A | 11/1998 | Sokn | |
| 5,874,679 A | 2/1999 | Sokn | |
| 5,877,093 A | 3/1999 | Heffner | |
| 5,996,419 A | 12/1999 | Sokn | |
| 6,094,356 A | 7/2000 | Fujisawa | |
| 6,266,197 B1 | 7/2001 | Glenn | |
| 6,351,996 B1 | 3/2002 | Nasiri | |
| 6,401,545 B1 | 6/2002 | Monk | |
| 6,440,777 B2 | 8/2002 | Cobbley | |
| 6,566,168 B2 | 5/2003 | Gang | |
| 6,707,168 B1 | 3/2004 | Hoffman | |
| 6,781,231 B2 | 8/2004 | Minervini | |
| 6,900,531 B2 | 5/2005 | Foong | |
| 6,927,482 B1 | 8/2005 | Kim | |
| 7,014,888 B2 | 3/2006 | McDonald | |
| 7,462,940 B2 | 12/2008 | Bauer | |
| 7,469,590 B2 | 12/2008 | Fukuda | |
| 7,549,344 B2 | 6/2009 | Yamamoto | |
| 7,568,390 B2 * | 8/2009 | Shizuno | 73/493 |
| 7,607,355 B2 | 10/2009 | Shirasaka | |
| 7,632,698 B2 | 12/2009 | Hooper | |
| 7,673,519 B1 | 3/2010 | Fuhrmann | |
| 7,705,242 B2 | 4/2010 | Winterhalter | |
| 7,886,609 B2 | 2/2011 | Lo | |
| 8,359,927 B2 | 1/2013 | Hooper | |
| 8,618,620 B2 * | 12/2013 | Winkler et al. | 257/415 |
| 2002/0041019 A1 | 4/2002 | Gang | |
| 2002/0063326 A1 | 5/2002 | Nakashima | |
| 2004/0014266 A1 | 1/2004 | Uno | |

(Continued)

*Primary Examiner* — Wensing Kuo
(74) *Attorney, Agent, or Firm* — Charles Bergere

(57) ABSTRACT

A semiconductor sensor device is packaged using a footed lid instead of a pre-molded lead frame. A semiconductor sensor die is attached to a first side of a lead frame. The die is then electrically connected to leads of the lead frame. A gel material is dispensed onto the sensor die. The footed lid is attached to the substrate such that the footed lid covers the sensor die and the electrical connections between the die and the lead frame. A molding compound is then formed over the substrate and the footed lid such that the molding compound covers the substrate, the sensor die and the footed lid.

8 Claims, 4 Drawing Sheets

(56) References Cited

U.S. PATENT DOCUMENTS

| | | |
|---|---|---|
| 2004/0187977 A1 | 9/2004 | Matsui |
| 2004/0245320 A1 | 12/2004 | Fukagaya |
| 2005/0104168 A1 | 5/2005 | Choi |
| 2005/0189621 A1 | 9/2005 | Cheung |
| 2005/0236644 A1 | 10/2005 | Getten |
| 2007/0023873 A1 | 2/2007 | Park |
| 2007/0298276 A1 | 12/2007 | Teshima |
| 2008/0050267 A1 | 2/2008 | Murai |
| 2009/0072399 A1 | 3/2009 | Terashima |
| 2009/0145237 A1* | 6/2009 | Li et al. ............ 73/756 |
| 2009/0211784 A1 | 8/2009 | Grogl |
| 2012/0139067 A1* | 6/2012 | Lo et al. ............ 257/417 |
| 2012/0306031 A1* | 12/2012 | Lo et al. ............ 257/415 |

* cited by examiner

US 9,029,999 B2

SEMICONDUCTOR SENSOR DEVICE WITH FOOTED LID

BACKGROUND OF THE INVENTION

The present invention relates generally to semiconductor sensor devices, and more particularly to a semiconductor sensor device with a footed lid.

Sensor devices such as pressure sensor devices are well known. Such devices use semiconductor pressure sensor dies. These dies are susceptible to mechanical damage during packaging and environmental damage when in use, and thus they must be carefully packaged. Further, sensor dies such as piezo resistive transducer (PRT), parameterized layout cell (Pcell) and Gyro do not allow full encapsulation because that would impede their functionality. Current pressure sensor packages typically mount the sensor die in a cavity of a pre-molded lead frame and then cover the cavity (and die) with a separate cover or lid. However, the lead frame pre-molding process is not robust, often having a low yield and mold related defects. Packages with pre-molded lead frames or pre-molded substrates have other associated issues such as mold flashing and voids, mold-die paddle co-planarity and cavity height inconsistency.

Accordingly, it would be advantageous to have a more reliable and economical way to package semiconductor sensor dies.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale. For example, the thicknesses of layers and regions may be exaggerated for clarity.

FIG. 3 illustrates a plurality of lead frames with an adhesive tape attached to the lead frames;

FIG. 4 illustrates a step of attaching semiconductor sensor dies to respective die pads of the lead frames of FIG. 3;

FIG. 5 shows a step of curing die-attach adhesive used to attach the semiconductor sensor dies to the lead frames;

FIG. 6 shows a step of electrically connecting the semiconductor sensor dies to respective lead frames;

FIG. 7 shows a step of dispensing a gel material on the semiconductor sensor dies;

FIG. 8 shows a step of attaching a footed lid to each lead frame;

FIG. 9 shows an alternate step of attaching a footed lid to each lead frame;

FIG. 10 illustrates a step of dispensing a gel material on the respective semiconductor sensor dies through a vent hole of the footed lid;

FIG. 11 shows a step of curing the gel material;

FIG. 12 illustrates a step of dispensing a molding material onto the lead frame, semiconductor sensor die and the footed lid; and FIG. 13 illustrates a step of separating packaged semiconductor sensor devices from adjacent packaged semiconductor sensor devices.

DETAILED DESCRIPTION OF THE INVENTION

Figure 1:
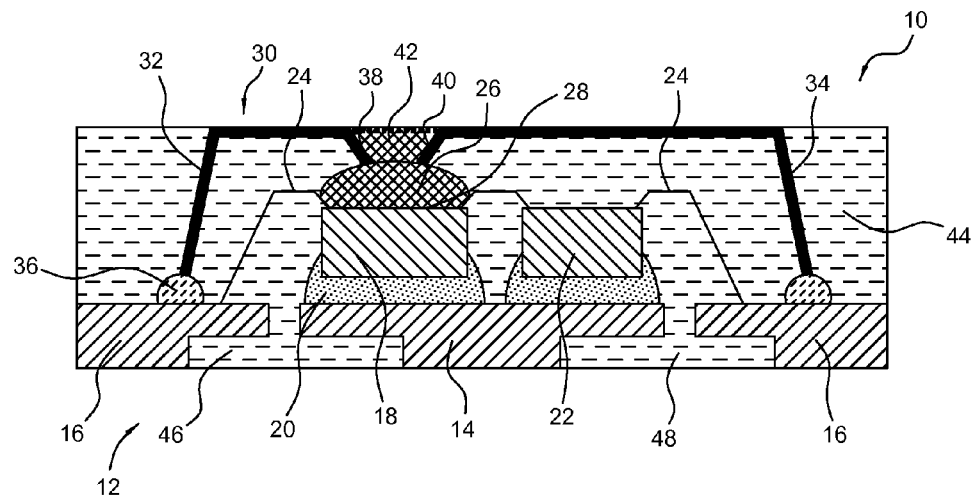
FIG. 1 is an enlarged cross-sectional view of a semiconductor sensor device in accordance with one embodiment of the present invention.

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention provides a method of packaging a semiconductor sensor die. The method includes providing a substrate having a first side including a die attach area and substrate electrical connection pads. A semiconductor sensor die such as a piezo resistive transducer (PRT) die or a pressure sensor die, is attached to the die attach area on the first side of the substrate and bond pads of the sensor die are electrically connected to the substrate electrical connection pads. A gel material is dispensed on a first side of the sensor die such that the gel material covers a membrane of the sensor die. A footed lid is attached to the first side of the substrate such that the footed lid surrounds the sensor die and the electrical connections between the sensor die and the substrate. The lid and the substrate form a cavity within which the sensor die is located. A molding compound is formed over the lid and the first side of the substrate. In one embodiment, the gel material is dispensed onto the surface of the sensor die before the lid is attached to the substrate and in an alternate embodiment, the gel material is dispensed onto the surface of the sensor die after the lid is attached to the substrate, by way of a vent hole in the top of the lid.

In another embodiment, the present invention provides a method of packaging a semiconductor sensor device that includes two sensor dies, one of which is a either a PRT die or a pressure sensor die and the other may be a G-cell or the like, and an integrated circuit die. A substrate having a first side including a die attach area and substrate electrical connection pads is provided and the two sensor dies and the integrated circuit die are attached to the die attach area. The two sensor dies are electrically connected to the integrated circuit die with bond wires and the integrated circuit die is electrically connected to the substrate electrical connection pads with additional bond wires. Side walls of a footed lid are attached to the first side of the substrate with a lid attach adhesive such that the footed lid surrounds the two sensor dies, the integrated circuit die, and the electrical connections between the integrated circuit die and the substrate. A cavity is formed between the footed lid and the first surface of the substrate. A gel material is dispensed onto a top surface of the PRT or pressure sensor die and a molding compound is formed over the footed lid and the first side of the substrate. The molding compound also substantially fills the cavity. In one embodiment the gel material is dispensed onto the PRT or pressure sensor die before the lid is attached to the substrate and in an alternate embodiment, the gel material is dispensed onto the PRT or pressure sensor die after the lid is attached to the substrate by way of a vent hole in a surface of the lid that is aligned with the top of the PRT or pressure sensor die.

In yet another embodiment, the present invention is a semiconductor sensor device assembled in accordance with the above-described methods.

Referring now to FIG. 1, a cross-sectional view of a packaged semiconductor sensor device 10 in accordance with an embodiment of the present invention is shown. The packaged semiconductor sensor device 10 includes a substrate such as a lead frame 12 with a die pad 14 and lead fingers 16. The lead frame 12 may be formed of copper, an alloy of copper, a copper plated iron/nickel alloy, plated aluminum, or the like.

A metal sheet may be processed to form the lead frame 12 with the die pad 14 and the lead fingers 16 using sawing, stamping and/or etching processes, as are known in the art. Alternatively, a pre-fabricated lead frame panel can be obtained from a separate supplier, where the lead frame already has been formed with die pads and lead fingers in a desired configuration.

A semiconductor sensor die 18 is attached and electrically coupled to the lead frame 12. In this exemplary embodiment of the invention, the semiconductor die 18 is a piezo resistive transducer (PRT) die. However, other sensor dies also may be attached in lieu of or in addition to the PRT die. For example, instead of a PRT die, a pressure sensor die could be attached to the substrate. Thus, although embodiments described below relate to a PRT die, it will be understood that these embodiments also apply to packaging a pressure sensor die. The semiconductor die 18 may be attached to the lead frame 12 using a die attach adhesive 20. The PRT die 18 and the lead frame 12 are well known components of semiconductor devices and thus detailed descriptions thereof are not necessary for a complete understanding of the present invention.

In certain exemplary embodiments, additional semiconductor dies such as represented by reference numeral 22 may be attached to the die pad 14 and electrically coupled to the lead frame 12 and/or to the other dies in the same package. For example, additional dies may include a microcontroller (MCU), a custom integrated circuit such as an ASIC and/or other types of sensor dies like a G-cell.

In this exemplary embodiment of the invention, the semiconductor dies 18 and 22 are attached and electrically coupled to the lead fingers 16 of the lead frame 12 via wires 24. The wires 24 are bonded to respective bond pads of the semiconductor dies 18 and 22 and to corresponding electrical connection pads on the lead frame 12, using a well known wire bonding process and known wire bonding equipment. The wires 24 are formed from a conductive material such as aluminium, gold, copper and solder, and may be either coated or uncoated.

A gel material 26 such as a silicon-based gel is deposited on a first surface 28 of the PRT die 18 such that the gel material 26 at least covers a membrane of the PRT die 18. The gel material 26 may also cover the die bond pads. A footed lid 30 with side walls indicated as 32 and 34 is attached to the first surface 28 of the substrate 12 such that the footed lid 30 surrounds the semiconductor dies 18 and 22. The footed lid 30 and the substrate 12 form a cavity within which the PRT die 18 and the die 22 are located. In this exemplary embodiment of the invention, the side walls 32, 34 are attached to respective lead fingers 16 with a lid attach adhesive 36 like non conductive epoxy. The footed lid 30 includes an opening or vent hole 42 that is aligned over the membrane of the PRT die 18, and the lid 32 has ends 38 and 40 around the vent hole 42 that may penetrate and be embedded within the gel material 26 and define the vent hole 42 on a top surface of the footed lid 30. The vent hole 42 may be formed in the lid by known fabrication processes such as drilling and punching.

In one exemplary embodiment of the invention, the side walls 32, 34 are attached to tie bars (not shown) that extend outwardly from the die pad 14. The side walls 32, 34 of the footed lid 30 are formed of a durable and stiff material so that the PRT die 18 (and any other dies such as the die 22) is protected. In a preferred embodiment, the footed lid 30 including the sides walls 32, 34, is formed of material such as stainless steel, plated metal or polymers. The footed lid 30 is sized and shaped depending on the number and size of the dies attached to the die attach pad. Accordingly, the lid 30 may have any shape, such as round, square or rectangular.

In certain embodiments, the vent hole 42 is used to facilitate air pressure measurement. In one example embodiment, the vent hole 42 is partially filled with the gel material 26 while in another embodiment, as shown in FIG. 1, the gel material 26 substantially fills the vent hole 42.

A molding compound 44 covers the footed lid 42 and extends beyond the footed lid 30 over the portions of the leads 16 that extend beyond the side walls 32, 34. The molding compound 44 also fills the cavity formed by the footed lid 30 and the lead frame 12 such that the molding compound 42 covers or encapsulates the semiconductor dies 18 and 22, and the electrical connections between the semiconductor dies 18 and 22 and the substrate electrical connection pads with the footed lid 30. The molding compound 42 also substantially fills gaps 46 and 48 between the die pad 14 and lead fingers 16. The molding compound 44 may include plastic or an epoxy molding compound, as is known in the art.

The example configuration of the packaged semiconductor sensor device 10 of FIG. 1 forms a no-leads type package such as a quad flat no-leads (QFN) package. In certain exemplary embodiments, the PRT die 18 of the device 10 is attached to a substrate such as a flexible or a laminated substrate instead of the lead frame 12, as discussed in more detail below. The use of a flexible or laminate substrate can prevent leakage of the gel material 36 from the device 10.

PRT sensor devices typically use pre-molded lead frames, that is, metal lead frames with a mold compound formed thereon that forms a cavity in which the PRT die is disposed. However, pre-molded lead frames are expensive. Thus, the present invention provides a method of assembling a PRT sensor device that does not use a pre-molded lead frame. Instead, a footed lid with molding is used either in conjunction with a lead frame or with a substrate (e.g., printed wiring board).

Figure 2:
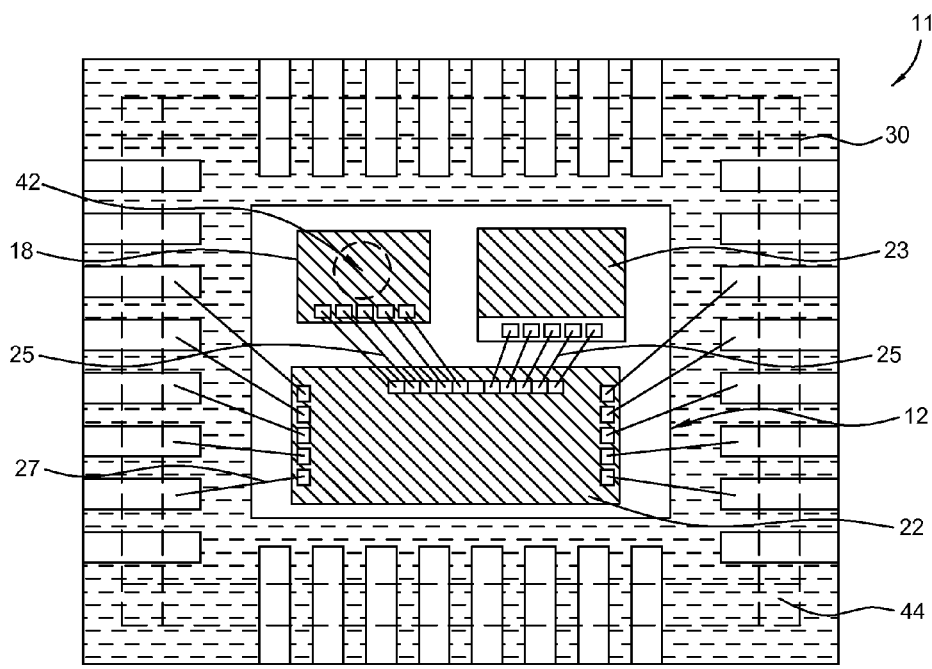
FIG. 2 is a top plan view of the semiconductor sensor device of FIG. 1 with a foot print of a lid therefor shown thereon.

FIG. 2 is a top view of an exemplary configuration of another embodiment of a sensor device 11. In this embodiment, the device 11 includes two sensor dies and an integrated circuit die. As illustrated, the sensor device 11 includes the PRT die 18 attached to the lead frame 12. In addition, the sensor device 10 includes a microcontroller (MCU) die 22 and a (G-cell) die 23. The PRT die 18 and the G-cell die 23 are electrically connected to the MCU die 22 with bond wires 25, and the MCU die 22 is electrically connected to with the leads or substrate electrical connection pads with additional bond wires 27.

Where the footed lid 30 surrounds the PRT die 18, MCU die 22, the G-cell die 23 and the electrical connections between the MCU die 22 and the substrate is shown in dashed lines. Here, the footed lid 30 includes the vent hole 42 aligned above the PRT die 18, also shown in dashed lines. The molding compound 44 covers the semiconductor dies 18, 22 and 23, and the electrical connections between the semiconductor dies 18, 22 and 23 and the substrate electrical connection pads as well as the footed lid 30.

Figure 3:
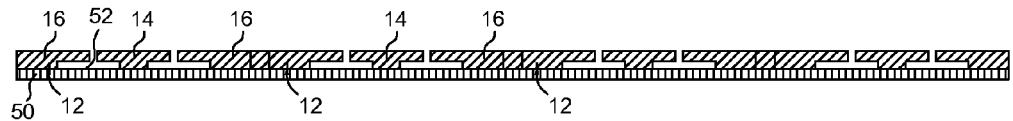
FIGS. 3-13 are side cross-sectional views illustrating various steps for assembling the semiconductor sensor device shown in FIG. 1, where

Referring now to FIGS. 3-13, a method of assembling a PRT device in accordance with an embodiment of the invention will be described. FIG. 3 is a side cross-sectional view showing a plurality of lead frames 12 with an adhesive tape 50 attached to a first or underside 52 of the lead frames 12. As illustrated, each lead frame 12 includes a die pad 14 and lead fingers 16. The plurality of lead frames 12 may be formed of a conductive material, such as Copper, as is known in the art and may be available in the form of a single strip with adjacent individual segmented frames or in an array format.

Figure 4:
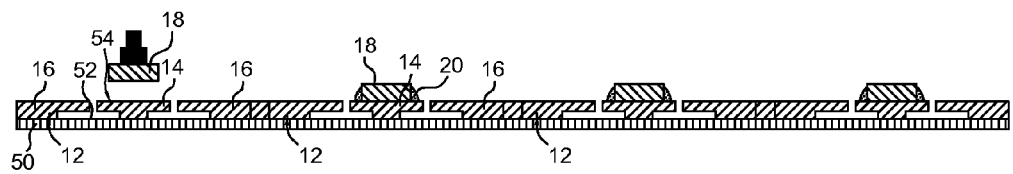
Figure 5:
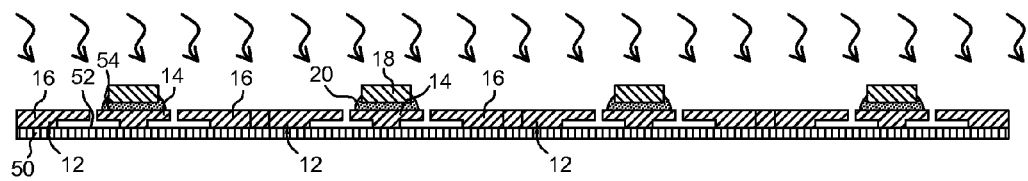

FIG. 4 is an illustration of a step of attaching the PRT die 18 to respective ones of the die pads 14 of the lead frames 12. The PRT dies 18 are attached to respective die pads 14 of the lead frames 12 with the die attach adhesive 20 such as die-bonding epoxy. The die attach adhesive 20 is dispensed on a top surface 54 of the die pads 14 of the lead frames 12 using a known dispensing device and the PRT 18 are placed on the die attach adhesive 20 to attach the PRT dies 18 to the respective die pads 14. The die attach adhesive 20 may subsequently be cured in an oven or via light waves to harden the die attach adhesive 20, as shown in FIG. 5.

Figure 6:
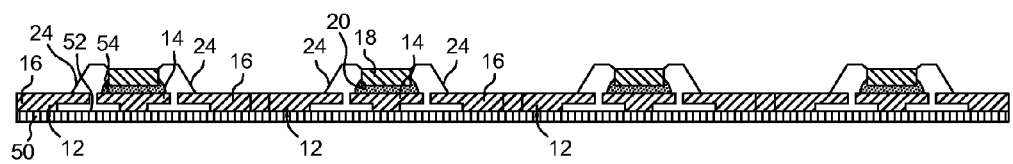

FIG. 6 shows the step of electrically connecting the PRT dies 18 to respective leads 16 of the lead frames 12. In this exemplary embodiment of the invention, bond pads of the PRT dies 18 are electrically connected to the lead fingers 16 of the lead frames 12 with the wires 24 using a well known wire bonding process and known wire bonding equipment.

Another way of connecting the semiconductor dies 18 to the lead frames 12 is through flip-chip bumps (not shown) attached to an underside of the semiconductor die 18. The flip-chip bumps may include solder bumps, gold balls, molded studs, or combinations thereof. The bumps may be formed or placed on the semiconductor die 18 using known techniques such as evaporation, electroplating, printing, jetting, stud bumping and direct placement. Each semiconductor die 18 is flipped and the bumps are aligned with contact pads (not shown) of the lead fingers 16.

In certain exemplary embodiments, the PRT device is assembled using a printed wiring board such as a substrate or flexible substrate. The PRT dies are attached to the substrate at predetermined locations using a die attach adhesive such as epoxy as is known in the art. The die attach step includes curing the epoxy such as with an oven. After curing, the substrate undergoes plasma cleaning and then the dies are electrically connected to the substrate via a wire bonding process using commercially available wire bonding equipment, also as is known in the art. That is, wires are used to interconnect bonding pads of the semiconductor die with electrical connection pads on the substrate.

Figure 7:
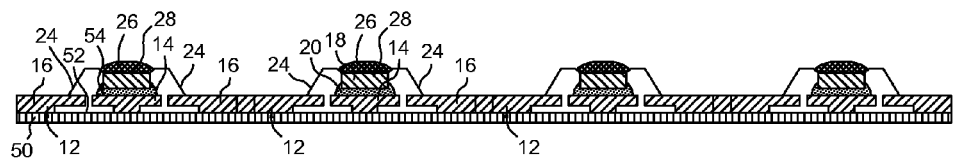

FIG. 7 shows the step of dispensing a gel material 26 onto a first or top side 28 of the PRT dies 18. The gel material 26, which may be a silicon-based gel, is dispensed to at least cover a portion of the top surface of the sensor dies 18. For example, for PRT dies 18, the gel material 26 should cover a membrane of the PRT die. The gel material 26 may also be dispensed such that it covers the top surface of the sensor die 18 and the bond pads on the top surface of the sensor die 18. The gel material 26 may be dispensed with a nozzle of a conventional dispensing machine, as is known in the art.

Figure 8:
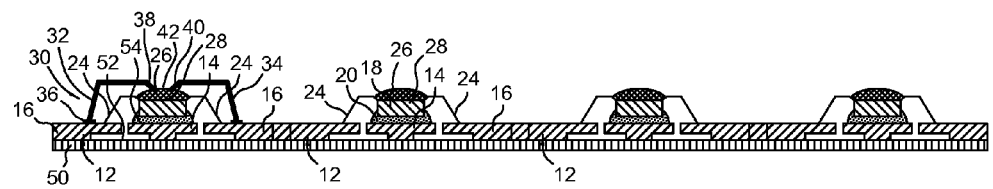

FIG. 8 shows the step of attaching footed lids 30 to each of the lead frames 12. In this embodiment, the side walls 32 and 34 of the lid 30 are attached to respective lead fingers 16 of each of the lead frames 12 using a lid attach adhesive 36 such that the footed lid 30 surrounds the semiconductor sensor die 18 and the electrical connections between the die 18 and the respective lead fingers 16.

The lid attach adhesive 36 is dispensed on a top surface of the lead fingers 16 using a known dispensing device and the side walls are placed on the lid attach adhesive 36 to attach the side walls 32 and 34 to the respective lead fingers 16. The lid attach adhesive 36 is subsequently cured in an oven. The footed lid 30 includes a vent hole 42 that is aligned over the PRT die 18. The vent hole 42 is defined by ends 38 and 40 in the lid 30. In the illustrated embodiment, the ends 38 and 40 of the footed lid 30 penetrate and are embedded within the gel material 26.

Figure 9:
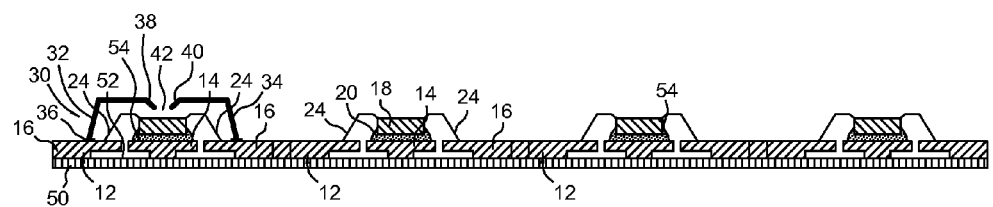
Figure 10:
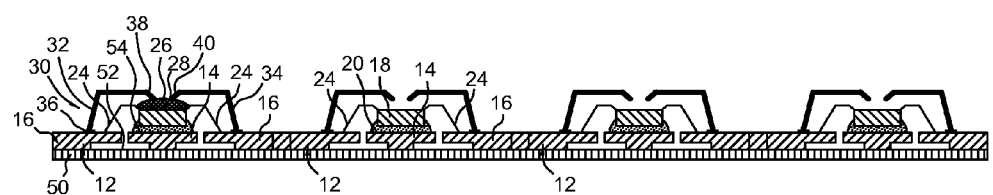

In an alternate embodiment, the gel material 26 is dispensed onto the surfaces of the sensor dies 18 after the footed lids 30 are attached to the lead frames 12, as illustrated in FIGS. 9 and 10. As illustrated in FIG. 9, after the PRT dies 18 are electrically connected to the respective lead frames 12, the footed lids 30 are attached to respective ones of the lead frames 12 using the lid attach adhesive 36, which is dispensed around an outer lead perimeter of the lead frames 12. The lid attach adhesive 36 is subsequently cured, preferably using an oven. The footed lid 30 includes the vent hole 42 on the top surface of the lid 30.

As illustrated in FIG. 10, the gel material 26 is dispensed onto the first side 28 of the respective PRT dies 18 through the vent hole 42 of the footed lid 30, which as previously discussed are aligned over the sensor dies 18. In this exemplary embodiment, the tops of the sensor dies 18 are covered with the gel material 26 and the vent holes 42 are substantially filled with the gel material 26.

Figure 11:
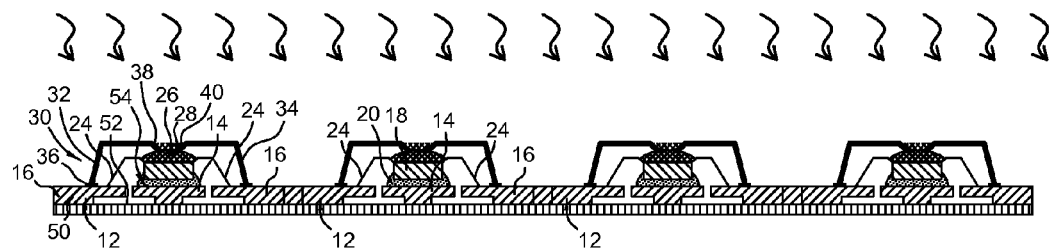

FIG. 11 shows the step of curing the gel material 26. That is, once the gel material 26 is dispensed and the footed lids 30 are attached to the respective lead frames 12, the gel material 36 is cured in an oven.

Figure 12:
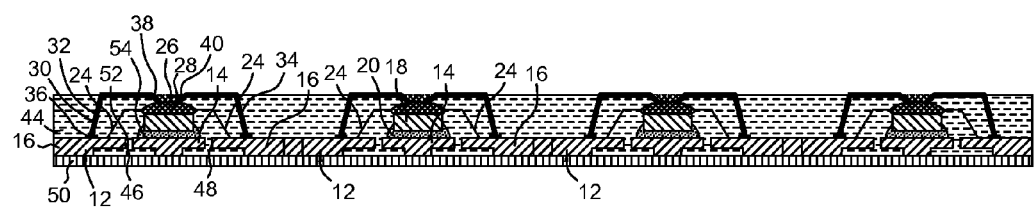

FIG. 12 shows the step of forming a molding material 44 such as epoxy onto the first side of the lead frame 12. The molding material 44 covers the respective lead frames 12, the semiconductor sensor dies 18 and the footed lid 30. Thus, the molding material 44 fills the cavities formed between the lids 30 and the first surfaces of the lead frames 12. As shown in the drawing, the molding material 44 fills spaces 46 and 48 between the die pad 14 and lead fingers 16 of the respective lead frames 12. One way of forming the molding compound over the lids 30 and the lead frames 12 is using a nozzle of a conventional dispensing machine, as is known in the art.

Alternatively, the molding material 44 may include a silica-filled resin, a ceramic, a halide-free material, the like, or combinations of the above. The molding material 44 is typically applied using a liquid, which is then heated to form a solid by curing in a UV or ambient atmosphere. The molding material 44 can also be a solid that is heated to form a liquid and then cooled to form a solid mold. In alternative embodiments, other encapsulating processes may be used. Subsequently, an oven is used to cure the molding material 44, whereby an array of semiconductor sensor devices is formed.

Figure 13:
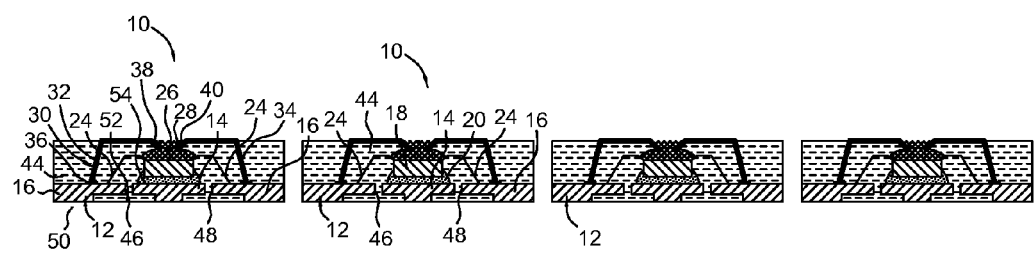

FIG. 13 shows the individual semiconductor sensor devices 10 being separated from each other by a singulation process. Singulation processes are well known and may include cutting with a saw or a laser. As illustrated, the plurality of lead frames 12 is singulated to form the individual semiconductor devices 10.

The present invention, as described above, allows for packaging a semiconductor die without requiring premolded lead frames to package the die. A semiconductor sensor die is attached to the die pad of the lead frame and a gel material is dispensed on the lead frame to cover the semiconductor sensor die. Further, a footed lid is attached to the lead frame that surrounds the semiconductor sensor die and the electrical connections between the die and the substrate. Moreover, a molding compound encapsulates the lead frame, semiconductor sensor die and the footed lid.

Thus, the present invention provides a method of packaging semiconductor sensor dies such as a pressure sensor die to form QFN packages with a lower package profile that does not require a premolded lead frame for facilitating lid attachment thereby reducing manufacturing costs for such packages. Such pressure sensor packaging may be utilized for a variety of applications such as automotive applications. Moreover, the packaging technique described above prevents issues such as mold burr, mold flash, mold planarity and cavity wall inconsistency for such semiconductor device packages.

By now it should be appreciated that there has been provided an improved packaged semiconductor sensor device and a method of forming the packaged semiconductor sensor device. Circuit details are not disclosed because knowledge thereof is not required for a complete understanding of the invention. Although the invention has been described using relative terms such as "front," "back," "top," "bottom," "over," "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A semiconductor sensor device, comprising:
   a substrate including a die attach area and a plurality of electrical connection pads;
   a semiconductor sensor die attached to the die attach area on a first surface of the substrate and electrically coupled to the substrate by way of the plurality of electrical connection pads;
   a gel material disposed on a top surface of the sensor die, the gel material covering a membrane of the sensor die;
   a footed lid, having a top and side walls, attached to the first surface of the substrate, wherein a cavity is formed by the lid and the substrate with the sensor die and electrical connections between the sensor die and the electrical connection pads of the substrate being located within the cavity; and
   a molding compound formed over the lid and the substrate first surface, and wherein the molding compound fills the cavity.

2. The semiconductor sensor device of claim 1, wherein the top of the footed lid includes a vent hole that is generally aligned over a membrane of the sensor die membrane and the gel material.

3. The semiconductor sensor device of claim 2, wherein the gel material covers the membrane and substantially fills the vent hole.

4. The semiconductor sensor device of claim 1, wherein the footed lid is attached to the first surface of the substrate proximate the substrate electrical connection pads with an adhesive.

5. The semiconductor sensor device of claim 1, wherein the sensor die includes a plurality of bonding pads on the sensor die top surface, wherein said bonding pads are electrically coupled to the substrate electrical connection pads with bond wires.

6. The semiconductor sensor device of claim 1, wherein the substrate comprises a flexible printed wiring board.

7. The semiconductor sensor device of claim 1, wherein the substrate comprises a lead frame, the die attach area comprises a die pad of the lead frame, and the substrate electrical connection pads comprise lead fingers.

8. The semiconductor sensor device of claim 1, wherein the lid is formed of metal.

* * * * *